United States Patent
Wang et al.

(10) Patent No.: US 9,430,976 B2
(45) Date of Patent: Aug. 30, 2016

(54) DETECTION SYSTEM AND METHOD FOR AUTOMATICALLY ADJUSTING GRAY SCALE

(71) Applicants: BOE TECHNOLOGY GROUP CO., LTD., Beijing (CN); BEIJING BOE DISPLAY TECHNOLOGY CO., LTD., Beijing (CN)

(72) Inventors: Song Wang, Beijing (CN); Jiuduan Su, Beijing (CN); Hongjiang Wu, Beijing (CN); Qun Fang, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 222 days.

(21) Appl. No.: 14/378,088

(22) PCT Filed: Dec. 13, 2013

(86) PCT No.: PCT/CN2013/089437
§ 371 (c)(1),
(2) Date: Aug. 11, 2014

(87) PCT Pub. No.: WO2014/187116
PCT Pub. Date: Nov. 27, 2014

(65) Prior Publication Data
US 2016/0093256 A1 Mar. 31, 2016

(30) Foreign Application Priority Data
May 20, 2013 (CN) .......................... 2013 1 0187599

(51) Int. Cl.
*G01N 21/86* (2006.01)
*G09G 3/36* (2006.01)
*H04N 1/407* (2006.01)
*G03F 1/42* (2012.01)

(52) U.S. Cl.
CPC ............ *G09G 3/3607* (2013.01); *H04N 1/407* (2013.01); *G03F 1/42* (2013.01); *G09G 2320/0626* (2013.01)

(58) Field of Classification Search
CPC .................. G09G 3/3607; G09G 2320/0626; G03F 1/42; H04N 1/407
USPC ....................................................... 250/559.3
See application file for complete search history.

(56) References Cited

U.S. PATENT DOCUMENTS 4,814,626 A * 3/1989 Doemens .............. G03F 9/7049
250/548
7,053,355 B2 * 5/2006 Ye ............................ G03F 1/84
250/208.1

FOREIGN PATENT DOCUMENTS

CN 103268028 A 8/2013

OTHER PUBLICATIONS

International Preliminary Report on Patentability issued Nov. 24, 2015; PCT/CN2013/089437.
PCT International Search Report (Chinese language), for PCT application No. PCT/CN2013/089437, 13 pages.
English translation of the Abstract for CN103268028A (listed above)—1 pg.

* cited by examiner

Primary Examiner — Seung C Sohn
(74) Attorney, Agent, or Firm — Ladas & Parry LLP

(57) ABSTRACT

A detection system and a method capable of automatically adjusting a gray scale are provided. The detection system includes a detection lens (1), wherein the detection lens (1) is configured to collect a mask alignment image (10) and a substrate alignment image (11) formed by images of a mask alignment mark (8) on a mask (6) and a substrate alignment mark (9) on the glass substrate (7); and an automatic filter device (4) provided in a light path in which the detection lens (1) forms the substrate alignment image (11), wherein the automatic filter device (4) comprises an automatic gray scale detection module (12), a control module (14) and a filter (13). The detection system and method capable of automatically adjusting a gray scale can automatically change the gray scale of the substrate alignment image (11), thereby to improve the automatization degree of the detection system.

20 Claims, 2 Drawing Sheets

DETECTION SYSTEM AND METHOD FOR AUTOMATICALLY ADJUSTING GRAY SCALE

CROSS REFERENCE TO RELATED APPLICATIONS

This application is based on International Application No. PCT/CN2013/089437 filed on Dec. 13, 2013, which claims priority to Chinese National Application No. 201310187599.X filed on May 20, 2013. The entire contents of each and every foregoing application are incorporated herein by reference.

TECHNICAL FIELD

Embodiments of the present invention relate to a detection system and method of automatically adjusting a gray scale.

BACKGROUND

As shown in FIG. 1, in the exposure process of fabricating RGB film of a color filter of liquid crystal display panel, four-point alignment method is often used to align a mask 6 with a glass substrate 7, that is, the mask 6 is aligned with the glass substrate 7 by aligning alignment marks at four corners of the mask 6 with alignment marks at four corners of the glass substrate 7, and an exposure is occurred only if the four points are simultaneously aligned.

The alignment of above points is achieved by a detection system. The detection system includes a detection lens 1, a semi-transparent reflector 2 and a light source 3; light emitted by the light source 3 passes through the semi-transparent reflector 2 and a negative pressure mask 5 and vertically irradiates on the mask 6 and the glass substrate 7; the detection lens 1 collects images of a mask alignment mark 8 on the mask 6 and a substrate alignment mark 9 on the glass substrate 7 so as to form a mask alignment image 10 and a substrate alignment image 11, and detects an alignment degree of the substrate alignment mark 9 and the mask alignment mark 8 by detecting a matching degree of the mask alignment image 10 and the substrate alignment image 11.

During aligning the above mask 6 with the glass substrate 7, if there are four substrate alignment images 11 having inconsistent gray scales in the detection system in one alignment process, the detection system would judge that the mask 6 is not aligned with the glass substrate 7, then it needs a manual adjustment, which allows the detection system having a low degree of automatization, thereby productivity is affected. In prior art, regions of four substrate alignment marks 9 on the glass substrate 7 are usually coated with photoresist so that their gray scales are consistent. However, for reason of cost saving, the coated regions are reduced in actual application, thus it cannot ensure that the whole regions of the substrate alignment marks 9 are coated. Therefore, the detection system has a high misalignment rate and a low degree of automatization.

SUMMARY

The embodiments of the invention provide a detection system and method of automatically adjusting a gray scale of a substrate alignment image formed by a detection lens.

According to an aspect of the present invention, a detection system capable of automatically adjusting a gray scale is provided, which comprises a detection lens, wherein the detection lens is configured to collect a mask alignment image and a substrate alignment image formed by images of a mask alignment mark on a mask and a substrate alignment mark on the glass substrate; and an automatic filter device provided in a light path in which the detection lens forms the substrate alignment image, the automatic filter device comprises an automatic gray scale detection module, a control module and a filter, wherein the automatic gray scale detection module is configured to detect a gray scale of the substrate alignment image formed by the detection lens, the control module is configured to add or remove the filter according to the gray scale of the substrate alignment image detected by the automatic gray scale detection module, and the filter is configured to filter out a portion of light in the optical path for reducing the gray scale of the substrate alignment image.

According to an embodiment of the present invention, the filter is provided in front of the detection lens.

According to an embodiment of the present invention, the filter can be red, blue or green.

According to an embodiment of the present invention, the filter has the same color as that of a color layer required to be fabricated in the process where the detection system is applied.

According to an embodiment of the present invention, the detection system further comprises a light source configured to emit light for irradiating on the substrate alignment mark of the glass substrate and the mask alignment mark of the mask, so as to improve recognizable degree of the substrate alignment mark and the mask alignment mark.

According to an embodiment of the present invention, the detection system further comprises a semi-transparent reflector provided between the detection lens and the mask, the semi-transparent reflector is configured to reflect the light emitted by the light source to irradiate on the mask alignment mark and the substrate alignment mark.

According to another aspect of the present invention, a method of automatically adjusting a gray scale of a detection system is provided. The method comprises detecting a gray scale of a substrate alignment image formed by a detection lens; and adding or removing a filter in the light path on which the detection lens forms the substrate alignment image according to the gray scale of the substrate alignment image so as to change the gray scale of the substrate alignment image.

According to yet another aspect of the present invention, a method for aligning a mask with a glass substrate is provided. The method uses a plurality of detection systems to align a plurality of mask alignment marks on the mask with a plurality of corresponding substrate alignment marks on the glass substrate so as to align the mask with the glass substrate. The method comprises detecting gray scales of the substrate alignment images formed by the detection lenses of the plurality of detection systems; when the substrate alignment images of the detection system have inconsistent gray scales, adding a filter in the light path in which the detection lens forms the substrate alignment images having a high gray scale in the detection system to reduce the gray scale of the substrate alignment image so that the gray scale of the substrate alignment images formed by the detection lens in the detection system are consistent.

According to an embodiment of the present invention, if a filter is added in the light path in which the detection lens forms the substrate alignment images, the color of the filter is the same as that of the color layer required to be fabricated in the process where the detection system is applied.

According to an embodiment of the present invention, if a filter is added in the light path in which the detection lens forms the substrate alignment images, the filter is provided in front of the detection lens.

According to an embodiment of the present invention, the filter is automatically or manually added.

BRIEF DESCRIPTION OF THE DRAWINGS

Embodiments of the present invention will be described in detail hereinafter in conjunction with accompanying drawings to allow one of ordinary skill in the art to understand the present invention more clearly, in which.

The reference signs: 1. detection lens; 2. semi-transparent reflector; 3. light source; 4. automatic filter device; 5. negative pressure mask; 6. mask; 7. glass substrate; 8. mask alignment mark; 9. substrate alignment mark; 10. mask alignment image; 11. substrate alignment image; 12. automatic gray scale detection module; 13. filter; 14. control module.

DETAILED DESCRIPTION OF THE PREFERRED EMBODIMENTS

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Figure 1:
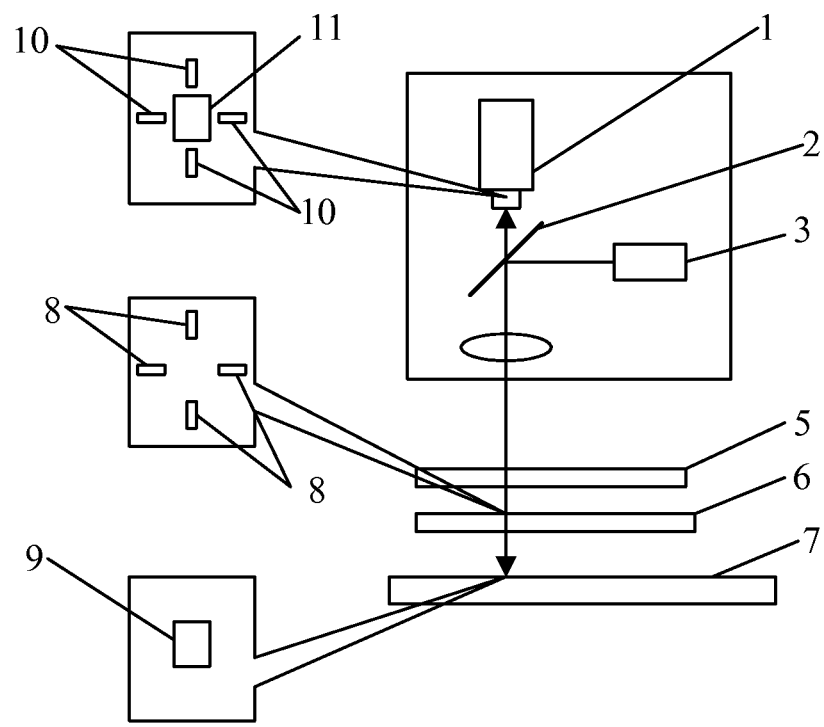
FIG. 1 is a schematic diagram of a detection system in the prior art.
Figure 2:
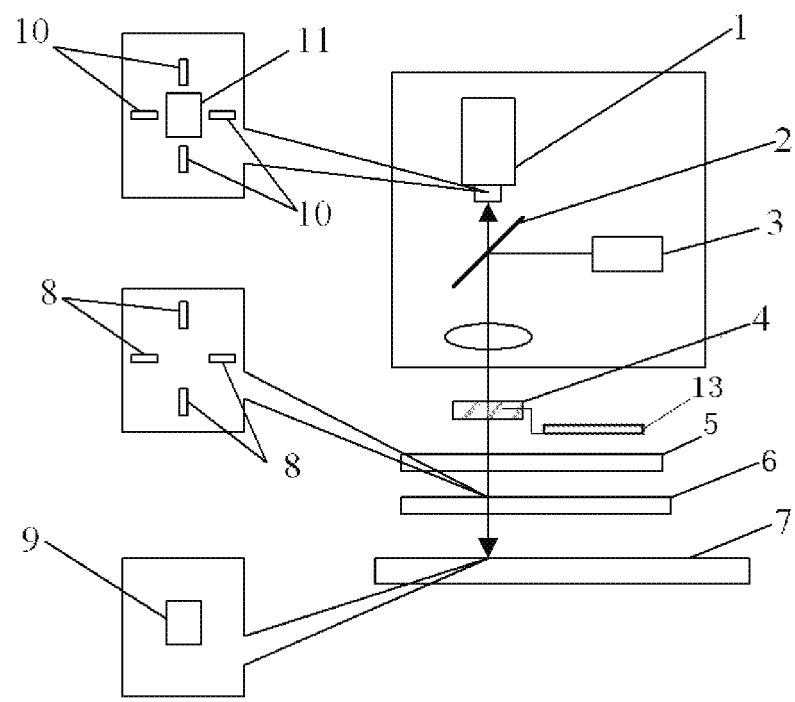
FIG. 2 is a schematic diagram of a detection system according to an embodiment of the present invention.
Figure 3:
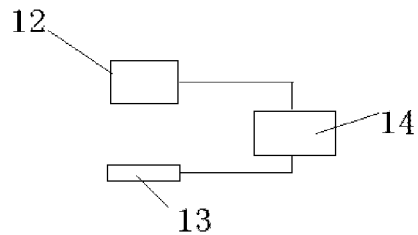
FIG. 3 is a schematic diagram of an automatic filter device according to an embodiment of the present invention.

An embodiment of the present invention provides a detection system capable of automatically adjusting a gray scale as shown in FIG. 2. The figure is only illustrative, the positions of various components in the figure is not limited to the situation as shown as long as the light path is not changed.

The detection system includes a detection lens 1, wherein the detection lens 1 is configured to collect images of a mask alignment mark 8 on the mask 6 and a substrate alignment mark 9 on the glass substrate 7 so as to form a mask alignment image 10 and a substrate alignment image 11.

In the detection system, an automatic filter device 4 is arranged in the light path in which the detect lens forms the substrate alignment image 11. The automatic filter device 4 comprises an automatic gray scale detection module 12, a control module 14 and a filter 13. The automatic gray scale detection module 12 is configured to detect a gray scale of the substrate alignment image 11 formed by the detection lens 1. The control module 14 is configured to add or remove the filter 13 according to the gray scale of the substrate alignment image 11 detected by the automatic gray scale detection module 12. The filter 13 is configured to filter out a portion of light in the optical path so that the gray scale of the substrate alignment image 11 is reduced.

The filter 13 is arranged in front of the detection lens 1. The filter 13 can be red, blue or green. The color of the filter 13 is generally the same as that of a color layer required to be fabricated in the process where the detection system is applied. For example, if the fabricated coating layer is red, a red filter is automatically selected; if the fabricated coating layer is green, a green filter is automatically selected; and the like. The filter 13 can be manually or automatically added in the detection light path or removed from the detection light path.

The detection system further comprises a light source 3 configured to emit light for irradiating on the substrate alignment mark 9 on the glass substrate 7 and the mask alignment mark 8 on the mask 6, so as to improve recognizable degree of the mask alignment mark 9 and the mask alignment mark 8.

The detection system further comprises a semi-transparent reflector 2 arranged between the detection lens 1 and the mask 6, the semi-transparent reflector 2 is configured to reflect the light emitted by the light source 3 to irradiate on the mask alignment mark 8 and the substrate alignment mark 9.

Figure 4:
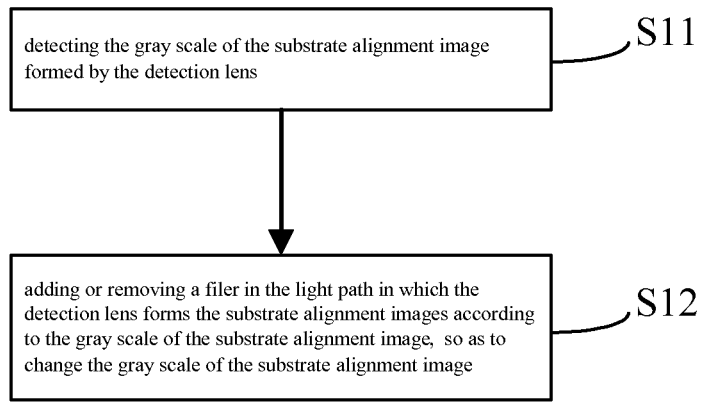
FIG. 4 is a flow diagram of a method of automatically adjusting a gray scale according to an embodiment of the present invention.

As shown in FIG. 4, according to another embodiment of the present invention, a method of automatically adjusting a gray scale by the detection system, which comprises the following steps.

S11: the gray scale of the substrate alignment image 11 formed by the detection lens 1 is detected.

S12: the filter 13 is added or removed in a light path in which the detection lens 1 forms the substrate alignment images 11 according to the gray scale of the substrate alignment image 11 so that the gray scale of the substrate alignment image 11 is changed. As understood by those skilled in the art, the filter 13 can be automatically or manually added.

Figure 5:
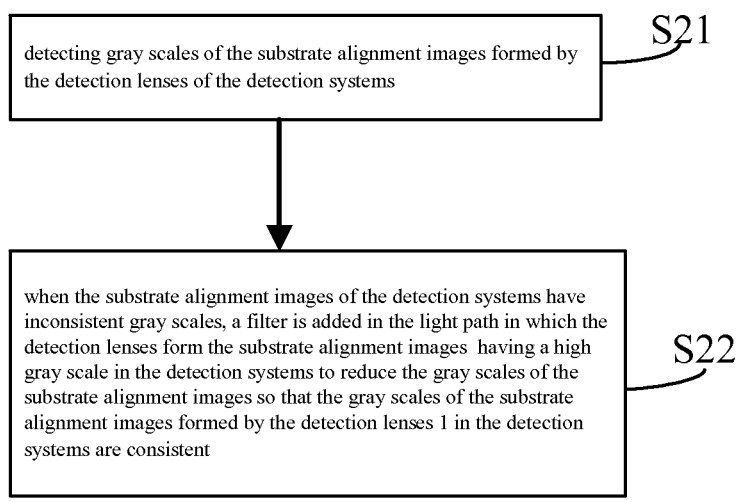
FIG. 5 is a flow diagram of a method of aligning a mask with a glass substrate according to an embodiment of the present invention.

As shown in FIG. 5, a method of aligning the mask 6 with the glass substrate 7 provided by another embodiment of the present invention uses multi-point alignment, that is the method uses a plurality of detection systems to align a plurality of mask alignment marks 8 on the mask 6 with a plurality of corresponding mask alignment marks 9 on the glass substrate 7 so as to align the mask 6 with the glass substrate 7. The method comprises the following steps.

S21: gray scales of the substrate alignment images 11 formed by the detection lenses 1 of the detection systems are detected.

S22: when the substrate alignment images 11 of the detection systems have inconsistent gray scales, a filter is added in a light path in which the detection lenses 1 form the substrate alignment images 11 having a high gray scale in the detection systems to reduce the gray scales of the substrate alignment images 11 so that the gray scales of the substrate alignment images 11 formed by the detection lenses 1 in the detection systems are consistent. As understood by those skilled in the art, the filter 13 can be automatically or manually added.

In step S22, if a filter is required to be added in the light path in which the detection lens 1 forms the substrate alignment images 11, the color of the filter 13 is the same as that of the color layer required to be fabricated in the process where the detection system is applied. The filter 13 can be automatically or manually added.

In step S22, if a filter 13 is required to be added in the light path in which the detection lens 1 forms the substrate alignment images 11, the filter 13 may be arranged in front of the detection lens 1. The filter 13 can be automatically or manually added.

In a detection system and a method of automatically adjusting a gray scale according to the embodiments of the present invention, the gray scale of the substrate alignment image can be automatically changed by adding a filter in the light path in which the detection lens forms the substrate alignment image, to improve the automatization degree of the detection system without limiting the design range and coating range of the substrate alignment mark, so as to reduce the cost. In a method of aligning the mask with the glass substrate according to the embodiments of the present invention, the gray scale of the substrate alignment image is reduced by detecting the gray scale of the substrate alignment image formed by the detection lens in the detection systems and by adding a filter in the light path in which the detection lens forms the substrate alignment images having a high gray scale in the detection system, so that all of the gray scales of the substrate alignment images formed by the detection lenses in the detection systems are consistent, thereby to improve the alignment accuracy and automatization degree.

It is understood that the described above are only illustrative embodiments, and the present invention is not intended to limited thereto. It is apparent that those skilled in the art can make various variations and modifications to the present invention without departure from the spirit and the scope of the present invention, and the present invention is intended to include such variations or modifications and equivalents thereof fall in the scope of the claims of the present invention.

What is claimed is:

1. A detection system capable of automatically adjusting a gray scale, comprising:
    a detection lens, wherein the detection lens is configured to collect a mask alignment image and a substrate alignment image respectively formed by images of a mask alignment mark on a mask and a substrate alignment mark on the glass substrate; and
    an automatic filter device provided in a light path in which the detection lens forms the substrate alignment image, wherein the automatic filter device comprises an automatic gray scale detection module, a control module and a filter,
    wherein the automatic gray scale detection module is configured to detect a gray scale of the substrate alignment image formed by the detection lens, the control module is configured to add or remove the filter according to the gray scale of the substrate alignment image detected by the automatic gray scale detection module, and the filter is configured to filter out a portion of light in the optical path to reduce the gray scale of the substrate alignment image.

2. The detection system capable of automatically adjusting a gray scale according to claim 1, wherein the filter is provided in front of the detection lens.

3. The detection system capable of automatically adjusting a gray scale according to claim 1, wherein the filter can be red, blue or green.

4. The detection system capable of automatically adjusting a gray scale according to claim 3, wherein the filter has the same color as that of a color layer required to be fabricated in the process where the detection system is applied.

5. The detection system capable of automatically adjusting a gray scale according to claim 1, further comprising:
    a light source configured to emit light for irradiating on the substrate alignment mark of the glass substrate and the mask alignment mark of the mask so that a recognizable degree of the substrate alignment mark and the mask alignment mark is improved.

6. The detection system capable of automatically adjusting a gray scale according to claim 5, further comprising:
    a semi-transparent reflector provided between the detection lens and the mask, wherein the semi-transparent reflector is configured to reflect the light emitted by the light source to irradiate on the mask alignment mark and the substrate alignment mark.

7. A method of automatically adjusting a gray scale of a detection system, comprising:
    detecting a gray scale of a substrate alignment image formed by a detection lens; and
    adding or removing a filter in a light path in which the detection lens forms the substrate alignment image according to the gray scale of the substrate alignment image so as to change the gray scale of the substrate alignment image.

8. The method according to claim 7, wherein the filter is added manually or automatically.

9. A method of aligning a mask with a glass substrate, using a plurality of detection systems to align a plurality of mask alignment marks on a mask with a plurality of corresponding substrate alignment marks on the glass substrate to align the mask with the glass substrate, and comprising:
    detecting gray scales of the substrate alignment images formed by the detection lenses of the detection systems; and
    when the substrate alignment images of the detection systems have inconsistent gray scales, adding a filter in the light path in which the detection lens forms the substrate alignment image having a high gray scale in the detection system to reduce the gray scale of the substrate alignment image so that the gray scales of the substrate alignment images formed by the detection lenses in the detection systems are consistent.

10. The method of aligning the mask with the glass substrate according to claim 9, wherein, if a filter is required to be added in the light path in which the detection lens forms the substrate alignment image, a color of the filter is the same as that of a color layer required to be fabricated in the process where the detection system is applied.

11. The method of aligning the mask with the glass substrate according to claim 9, wherein, if a filter is required to be added in the light path in which the detection lens forms the substrate alignment image, the filter is provided in front of the detection lens.

12. The method of aligning the mask with the glass substrate according to claim 11, wherein the filter is added manually or automatically.

13. The detection system capable of automatically adjusting a gray scale according to claim 2, wherein the filter can be red, blue or green.

14. The detection system capable of automatically adjusting a gray scale according to claim 13, wherein the filter has the same color as that of a color layer required to be fabricated in the process where the detection system is applied.

15. The detection system capable of automatically adjusting a gray scale according to claim 1, wherein the filter has the same color as that of a color layer required to be fabricated in the process where the detection system is applied.

16. The detection system capable of automatically adjusting a gray scale according to claim 2, wherein the filter has the same color as that of a color layer required to be fabricated in the process where the detection system is applied.

17. The detection system capable of automatically adjusting a gray scale according to claim 2, further comprising:
a light source configured to emit light for irradiating on the substrate alignment mark of the glass substrate and the mask alignment mark of the mask so that a recognizable degree of the substrate alignment mark and the mask alignment mark is improved.

18. The detection system capable of automatically adjusting a gray scale according to claim 3, further comprising:
a light source configured to emit light for irradiating on the substrate alignment mark of the glass substrate and the mask alignment mark of the mask so that a recognizable degree of the substrate alignment mark and the mask alignment mark is improved.

19. The detection system capable of automatically adjusting a gray scale according to claim 4, further comprising:
a light source configured to emit light for irradiating on the substrate alignment mark of the glass substrate and the mask alignment mark of the mask so that a recognizable degree of the substrate alignment mark and the mask alignment mark is improved.

20. The detection system capable of automatically adjusting a gray scale according to claim 19, further comprising:
a semi-transparent reflector provided between the detection lens and the mask, wherein the semi-transparent reflector is configured to reflect the light emitted by the light source to irradiate on the mask alignment mark and the substrate alignment mark.

\* \* \* \* \*